United States Patent
Sung et al.

(10) Patent No.: US 10,985,263 B2
(45) Date of Patent: Apr. 20, 2021

(54) THIN FILM CAP TO LOWER LEAKAGE IN LOW BAND GAP MATERIAL DEVICES

(71) Applicant: Intel Corporation, Santa Clara, CA (US)

(72) Inventors: Seung Hoon Sung, Portland, OR (US); Dipanjan Basu, Hillsboro, OR (US); Ashish Agrawal, Hillsboro, OR (US); Van H. Le, Beaverton, OR (US); Benjamin Chu-Kung, Portland, OR (US); Harold W. Kennel, Portland, OR (US); Glenn A. Glass, Portland, OR (US); Anand S. Murthy, Portland, OR (US); Jack T. Kavalieros, Portland, OR (US); Tahir Ghani, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/465,763

(22) PCT Filed: Dec. 31, 2016

(86) PCT No.: PCT/US2016/069647
§ 371 (c)(1),
(2) Date: May 31, 2019

(87) PCT Pub. No.: WO2018/125257
PCT Pub. Date: Jul. 5, 2018

(65) Prior Publication Data
US 2020/0083354 A1    Mar. 12, 2020

(51) Int. Cl.
*H01L 29/66*    (2006.01)
*H01L 29/08*    (2006.01)
(Continued)

(52) U.S. Cl.
CPC .... *H01L 29/66659* (2013.01); *H01L 29/0847* (2013.01); *H01L 29/66628* (2013.01);
(Continued)

(58) Field of Classification Search
CPC ........... H01L 29/66659; H01L 29/0847; H01L 29/66628; H01L 29/66636; H01L 29/7848;
(Continued)

(56) References Cited

U.S. PATENT DOCUMENTS 8,222,101 B2     7/2012   Rouh et al.
2006/0237746 A1* 10/2006  Orlowski .......... H01L 29/66636
                                                    257/192
(Continued)

FOREIGN PATENT DOCUMENTS

JP          09191107          7/1997
KR          100771552         10/2007
WO    WO 2017/111914 A1 *    6/2017

OTHER PUBLICATIONS

International Search Report and Written Opinion for International Patent Application No. PCT/US2016/069647, dated Sep. 19, 2017.
(Continued)

*Primary Examiner* — Cuong B Nguyen
(74) *Attorney, Agent, or Firm* — Green, Howard & Mughal LLP (57) ABSTRACT

An apparatus is provided which comprises: a semiconductor region on a substrate, a gate stack on the semiconductor region, a source region of doped semiconductor material on the substrate adjacent a first side of the semiconductor region, a cap region on the substrate adjacent a second side of the semiconductor region, wherein the cap region comprises semiconductor material of a higher band gap than the semiconductor region, and a drain region comprising doped
(Continued)

semiconductor material on the cap region. Other embodiments are also disclosed and claimed.

19 Claims, 8 Drawing Sheets

(51) Int. Cl.
  *H01L 29/78* (2006.01)
  *H01L 29/165* (2006.01)
(52) U.S. Cl.
  CPC .... *H01L 29/66636* (2013.01); *H01L 29/7848* (2013.01); *H01L 29/165* (2013.01)
(58) Field of Classification Search
  CPC ............ H01L 29/165; H01L 29/66621; H01L 21/02381; H01L 21/0245; H01L 21/02532; H01L 31/035254; H01L 31/03687; H01L 31/03765; H01L 31/0745; H01L 21/76841–76876; H01L 23/53223; H01L 23/53238; H01L 23/53252; H01L 23/53266; H01L 41/0815
  See application file for complete search history.

(56) References Cited

U.S. PATENT DOCUMENTS

| 2008/0057635 | A1 | 3/2008 | Chen |
| 2015/0243756 | A1 | 8/2015 | Obradovic et al. |
| 2016/0027875 | A1 | 1/2016 | Kim et al. |
| 2016/0133695 | A1 | 5/2016 | Huang et al. |

OTHER PUBLICATIONS

International Search Report and Written Opinion for International Patent Application No. PCT/US2016/069648, dated Sep. 19, 2017.
International Preliminary Report on Patentability from PCT/US16/69647 dated Jul. 11, 2019, 11 pgs.

* cited by examiner

THIN FILM CAP TO LOWER LEAKAGE IN LOW BAND GAP MATERIAL DEVICES

CLAIM OF PRIORITY

This Application is a National Stage Entry of, and claims priority to, PCT Application No. PCT/US16/69647, filed on Dec. 31, 2016 and titled "THIN FILM CAP TO LOWER LEAKAGE IN LOW BAND GAP MATERIAL DEVICES", which is incorporated by reference in its entirety for all purposes.

BACKGROUND

In semiconductor devices, leakage is a quantum phenomenon where mobile charge carriers (electrons or holes) tunnel across a junction or through an insulating region. Leakage increases exponentially as the thickness of the insulating region decreases. Tunneling leakage can also occur across semiconductor junctions between heavily doped p-type and n-type semiconductors. Gate-induced drain leakage (GIDL) is a leakage mechanism in metal-oxide-semiconductor field-effect transistors (MOSFETs) due to large field effect in the drain junction. Leakage increases power consumption and if sufficiently large may possibly cause circuit failure.

The excess power consumption attributable to leakage can be one of the main factors limiting increased computer processor performance. Some efforts to minimize some types of leakage include the use of high-k dielectrics, strained silicon and/or stronger dopant levels in the semiconductor. While low band gap materials, such as germanium, may be advantageous for low voltage semiconductor devices, they may be more susceptible to leakage, particularly when heavily doped.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

A thin film cap to lower leakage in low band gap material devices is generally presented. In this regard, embodiments of the present invention enable pull-back of the valence band creating a larger distance for holes to tunnel in the drain junction. One skilled in the art would appreciate that this approach may enable lower off currents ($I_{off}$) by lowering the probability of tunneling without significantly impacting external resistance ($R_{ext}$).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1:
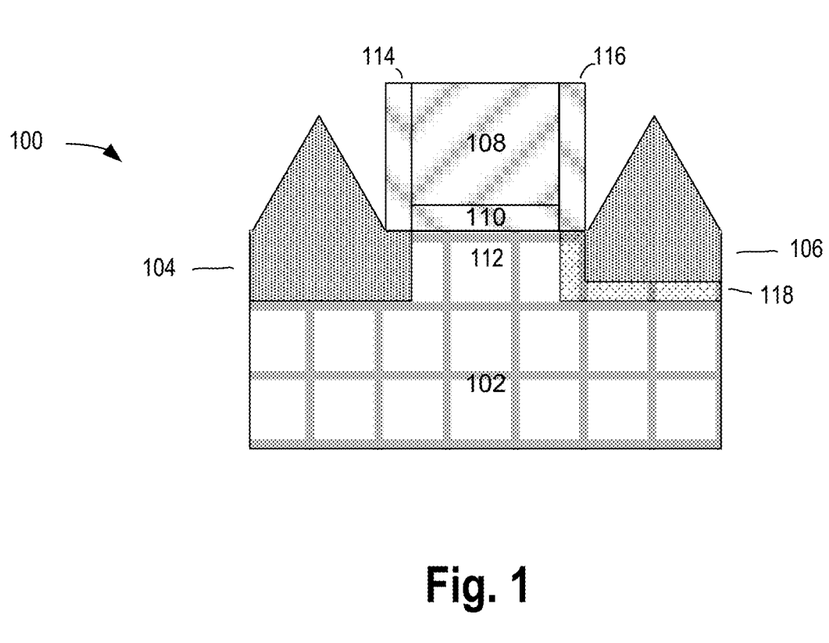
FIG. 1 illustrates a cross-sectional view of an example semiconductor device with a thin film cap, according to some embodiments.

FIG. 1 illustrates a cross-sectional view of an example semiconductor device with a thin film cap, according to some embodiments. As shown, device 100 includes substrate 102, source region 104, drain region 106, gate region 108, gate dielectric 110, semiconductor region 112, gate spacer 114, gate spacer 116, and cap region 118. While shown as being a source/drain (RSD) transistor, in other embodiments, device 100 may be a different topology, such as a planar transistor, or different device, such as a diode.

In some embodiments, substrate 102 comprises at least one layer of undoped semiconductor, such as Ge, Si, SiGe, InGaAs, AlSb, etc., which may form semiconductor region 112. Substrate 102 may be composed of one or more semiconductor material layers on top of another semiconductor material such as silicon. In some embodiments, substrate 102 includes a buried oxide layer (not shown) that is adjacent to semiconductor region 112. When device 100 is in an active mode, semiconductor region 112 may serve as a channel between source region 104 and drain region 106, located on opposite sides of semiconductor region 112. In some embodiments, source region 104 and drain region 106 are p-doped variants of the same semiconductor as semiconductor region 112, for example germanium.

Cap region 118 may represent a thin film partition between semiconductor region 112 and drain region 106, comprised of semiconductor material(s) having a higher band gap than semiconductor region 112. In some embodiments cap region 118 may comprise silicon (band gap of 1.11 eV) when semiconductor region 112 is germanium (band gap of 0.67 eV), for example. However, in other embodiments, alloys of silicon or other semiconductor material may be used in cap region 118. In some embodiments, cap region 118 may contain multiple layers of different semiconductor material. In some embodiments, cap region 118 may contain a layer of strained silicon over a layer of silicon-germanium. The presence of cap region 118 may have the effect of pulling-back the valence band and creating a larger distance for holes to tunnel in the drain region 106 junction. Cap region 118 may enable lower off currents ($I_{off}$) by lowering the probability of tunneling without significantly impacting external resistance ($R_{ext}$). In some embodiments, cap region 118 has a depth commensurate with gate spacer 116 of about 10 nm or less. While device 100 is shown as being asymmetrical, in some embodiments, source region 104 may also include a cap region of higher band gap semiconductor material than semiconductor region 112, making device 100 substantially symmetrical.

Gate region 108, along with gate dielectric 110 and gate spacers 114 and 116, may form a gate stack on semiconductor region 112. Gate region 108 may be a metal coupled with interconnects, not shown, to provide a voltage proximate to semiconductor region 112 to place device 100 into an active mode. In some embodiments, gate dielectric 110 and gate spacers 114 and 116 may include oxides and/or nitrides.

Figure 2A:
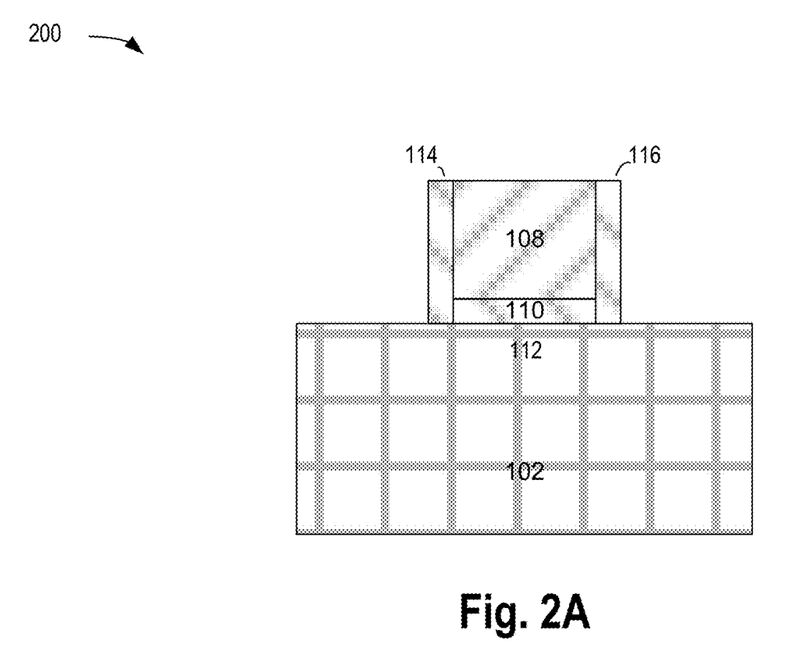
FIGS. 2A-2H illustrate cross-sectional views of manufacturing steps of a semiconductor device with a thin film cap, according to some embodiments.

FIGS. 2A-2H illustrate cross-sectional views of manufacturing steps of a semiconductor device with a thin film cap, according to some embodiments. As shown in FIG. 2A, assembly 200 includes substrate 102, gate region 108, gate dielectric 110, semiconductor region 112, gate spacer 114, and gate spacer 116. The gate stack formed by gate region 108, gate dielectric 110, gate spacer 114, and gate spacer 116, may be formed on semiconductor layer 112 over multiple steps and may include additional layers not shown.

Figure 2B:
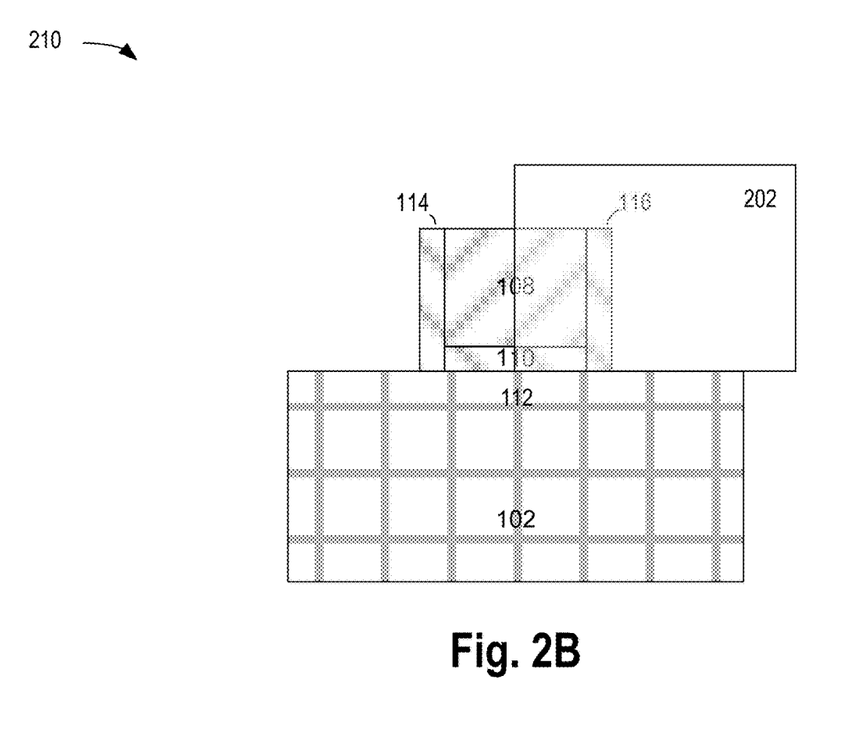

FIG. 2B shows assembly 210, which may include drain side blocking mask 202 deposited on a (top) surface of semiconductor region 112. Drain side blocking mask 202 may be formed through multiple lithography steps. In some embodiments, drain side blocking mask 202 may cover at least portions of gate region 108 and gate spacer 116.

Figure 2C:
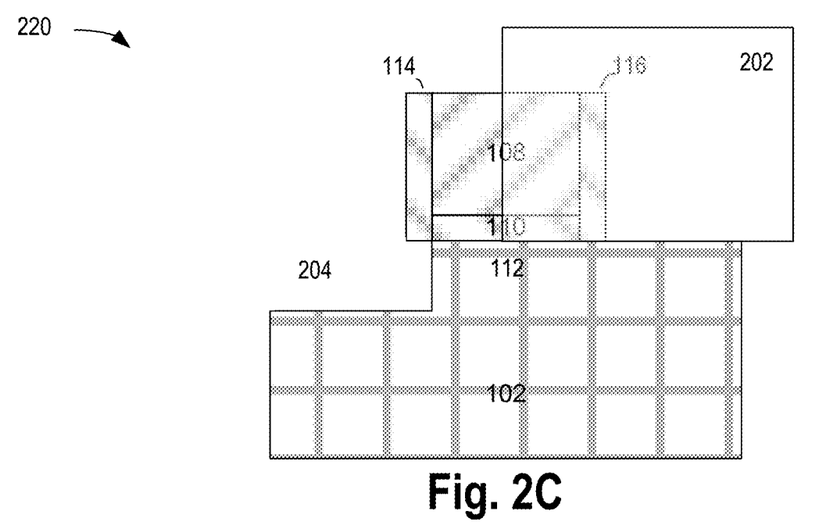

As shown in FIG. 2C, assembly 220 has had some of semiconductor material 112 removed, for example through etching, to form opening 204. In some embodiments, opening 204 extends under gate spacer 114. In some embodiments, opening 204 includes a side surface perpendicular to a bottom surface.

Figure 2D:
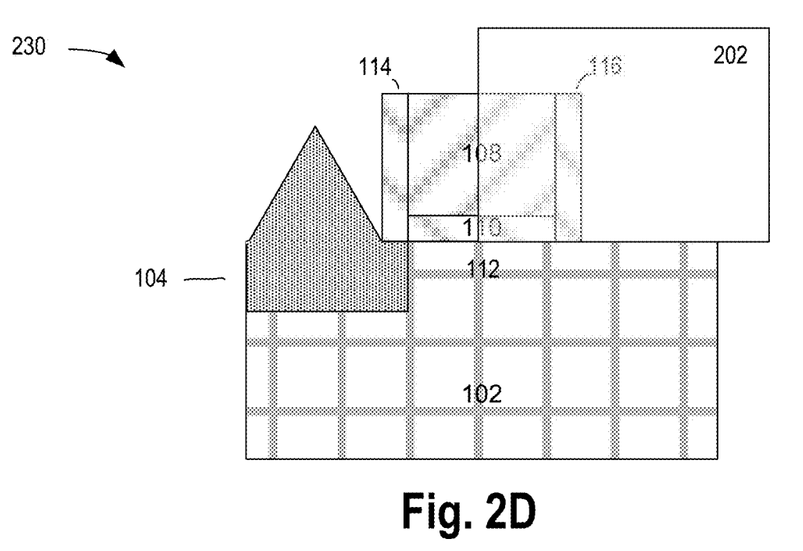

Turning now to FIG. 2D, assembly 230 may include source region 104. In some embodiments, source region 104 is grown epitaxially in, and raised above, opening 204. In some embodiments, source region 104 is p-type semiconductor material. In some embodiments, source region 104 is highly doped. In some embodiments, source region 104 may also include a cap region as described herein in reference to a drain region.

Figure 2E:
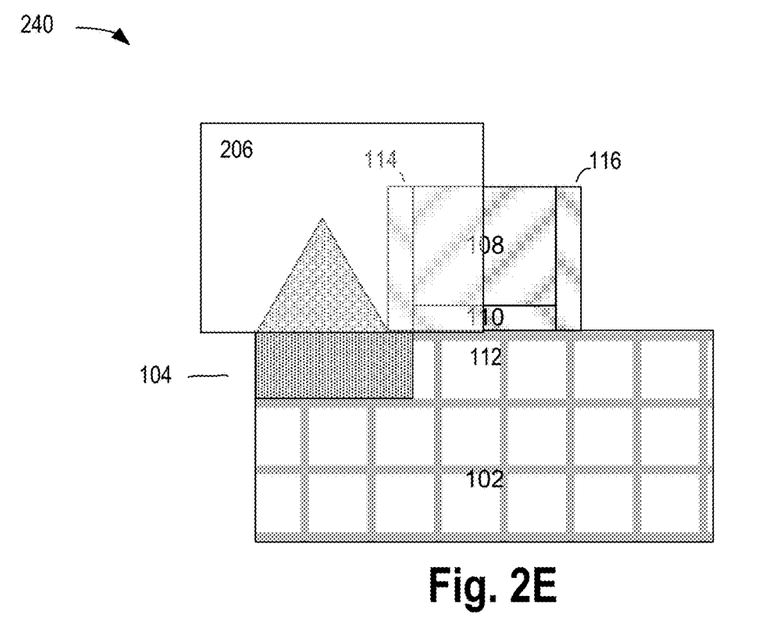

FIG. 2E shows assembly 240, which may include source side blocking mask 206 deposited on source region 104. Drain side blocking mask 202 may have been removed and source side blocking mask 206 may be formed through multiple lithography steps. In some embodiments, source side blocking mask 206 may cover at least portions of gate region 108 and gate spacer 114.

Figure 2F:
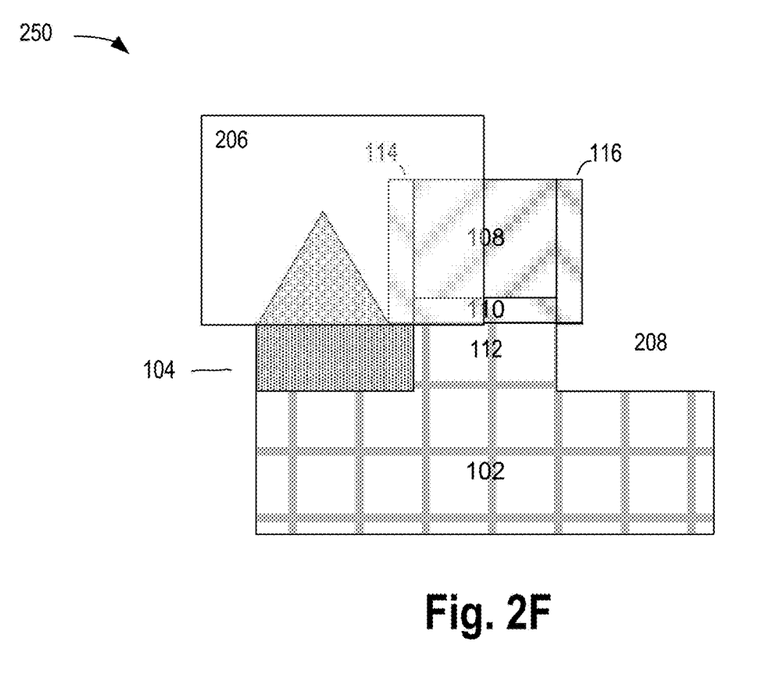

As shown in FIG. 2F, for assembly 250 the steps of removing material from semiconductor region 112 may have been repeated on an opposite side of semiconductor region 112 to form opening 208. In some embodiments, opening 208 may extend under gate spacer 116. In some embodiments, opening 208 includes a side surface perpendicular to a bottom surface.

Figure 2G:
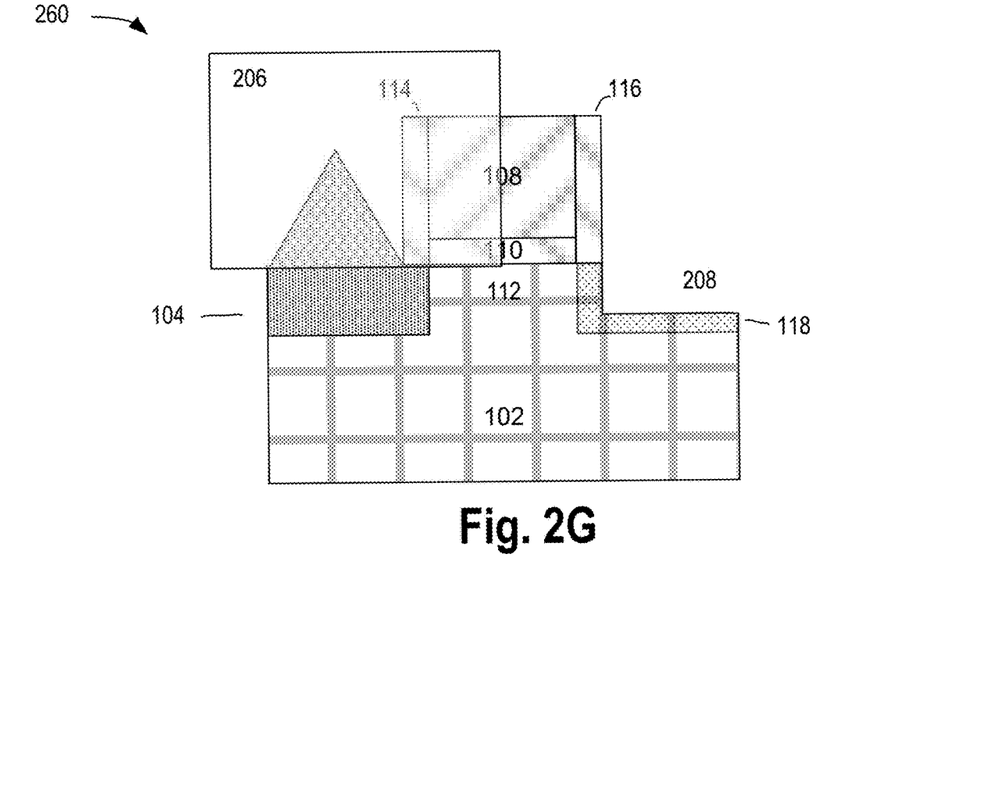

Turning now to FIG. 2G, assembly 260 may include cap region 118 formed in opening 208 adjacent to a side of semiconductor region 112. In some embodiments, cap region 118 is epitaxially grown through a deposition process, such as chemical vapour deposition for example. In some embodiments, cap region 118 is semiconductor material(s) having a higher band gap than semiconductor region 112. For example, cap region 118 may be silicon when semiconductor region 112 is germanium, however silicon-germanium or other semiconductor material may be used for cap region 118. In some embodiments, cap region 118 may contain multiple layers of different semiconductor material. In some embodiments, cap region 118 may contain a layer of strained silicon over a layer of silicon-germanium. In some embodiments, cap region 118 has a depth of about 10 nm or less. Cap region 118 may include a sidewall perpendicular to a bottom. In some embodiments, a sidewall and bottom of cap 118 may have different depths that vary from and among each other.

Figure 2H:
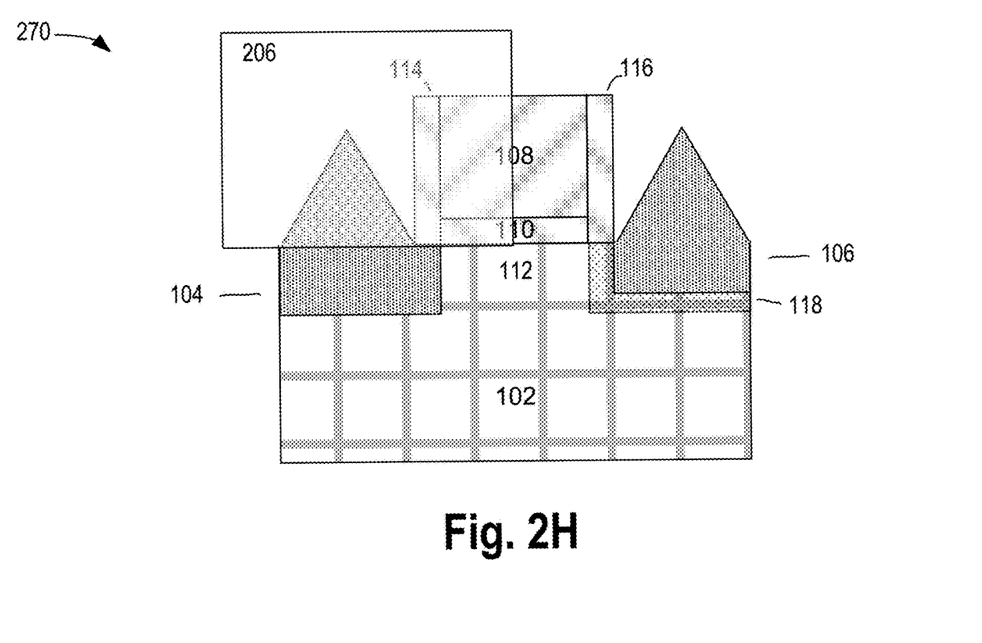

FIG. 2H shows assembly 270, which may include drain region 106 formed on cap region 118, filling, and potentially raised above, opening 208. Drain region 106 may be formed epitaxially on cap region 118 and may comprise a p-doped variant of the semiconductor material in semiconductor region 112, for example germanium.

Figure 3:
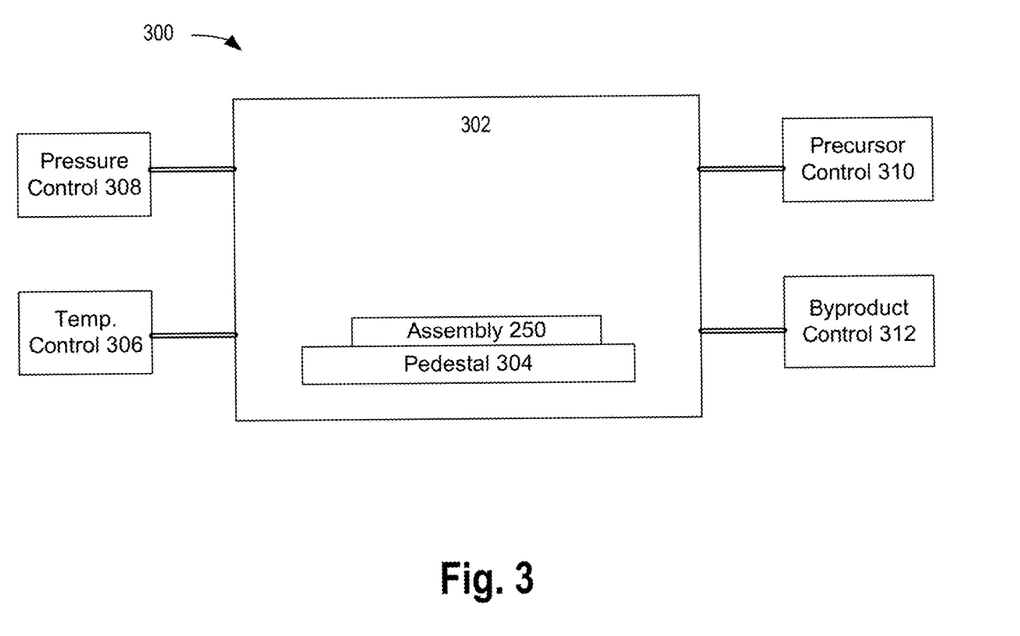
FIG. 3 illustrates a diagram of an example semiconductor manufacturing equipment, according to some embodiments.

FIG. 3 illustrates a diagram of an example semiconductor manufacturing equipment, according to some embodiments. As shown, equipment 300 includes chamber 302, assembly 250, pedestal 304, temperature control 306, pressure control 308, precursor control 310 and byproduct control 312.

In some embodiments, chamber 302 contains the reactions of a deposition process, such as a chemical vapour deposition for example, and is made of material that does not react with the chemicals being used. In some embodiments, chamber 302 must withstand high temperatures.

Pedestal 304 may be present to support assembly 250. In some embodiments, pedestal 304 is a source of heat energy in chamber 302.

Temperature control 306 may control the temperature within chamber 302. In some embodiments, temperature control 306 may control air temperature within chamber 302 and/or heat energy provided to pedestal 304. In some embodiments, temperature control 306 may provide a temperature in chamber 302 of between about 25 and 1300 degrees Celsius during a deposition process, such as a MOCVD process for example.

Pressure control 308 may control the pressure within chamber 302 as part of a deposition process. In some embodiments, pressure control 308 may provide a pressure in chamber 302 of between about 1 mTorr and 700 Torr during a deposition process, such as a physical vapor deposition (PVD) process for example.

Precursor control 310 may introduce precursor molecules, in the form of liquids and/or gases, proximate to a surface of assembly 250, for example opening 208, as part of a deposition process. In some embodiments, precursor control 310 may introduce one or more precursors to epitaxially form cap region 118 and drain region 106. In some embodiments, precursor control 310 may change the precursors introduced proximate to opening 208 as cap region 118 is formed to form multiple layers of different semiconductor material. In some embodiments, after cap region 118 is formed, precursor control 310 may introduce different precursor molecules proximate to opening 208 to form drain region 106 with the introduction of dopants. Some examples of precursors that may be used include, but are not limited to, isobutylgermane, dimethylamino germanium trichloride, tetramethylgermane, or tetraethylgermanium.

Byproduct control 312 may contain deposition reaction byproducts. In some embodiments, byproduct control 312 may contain hydrocarbon and organo-amine reaction byproducts.

Figure 4:
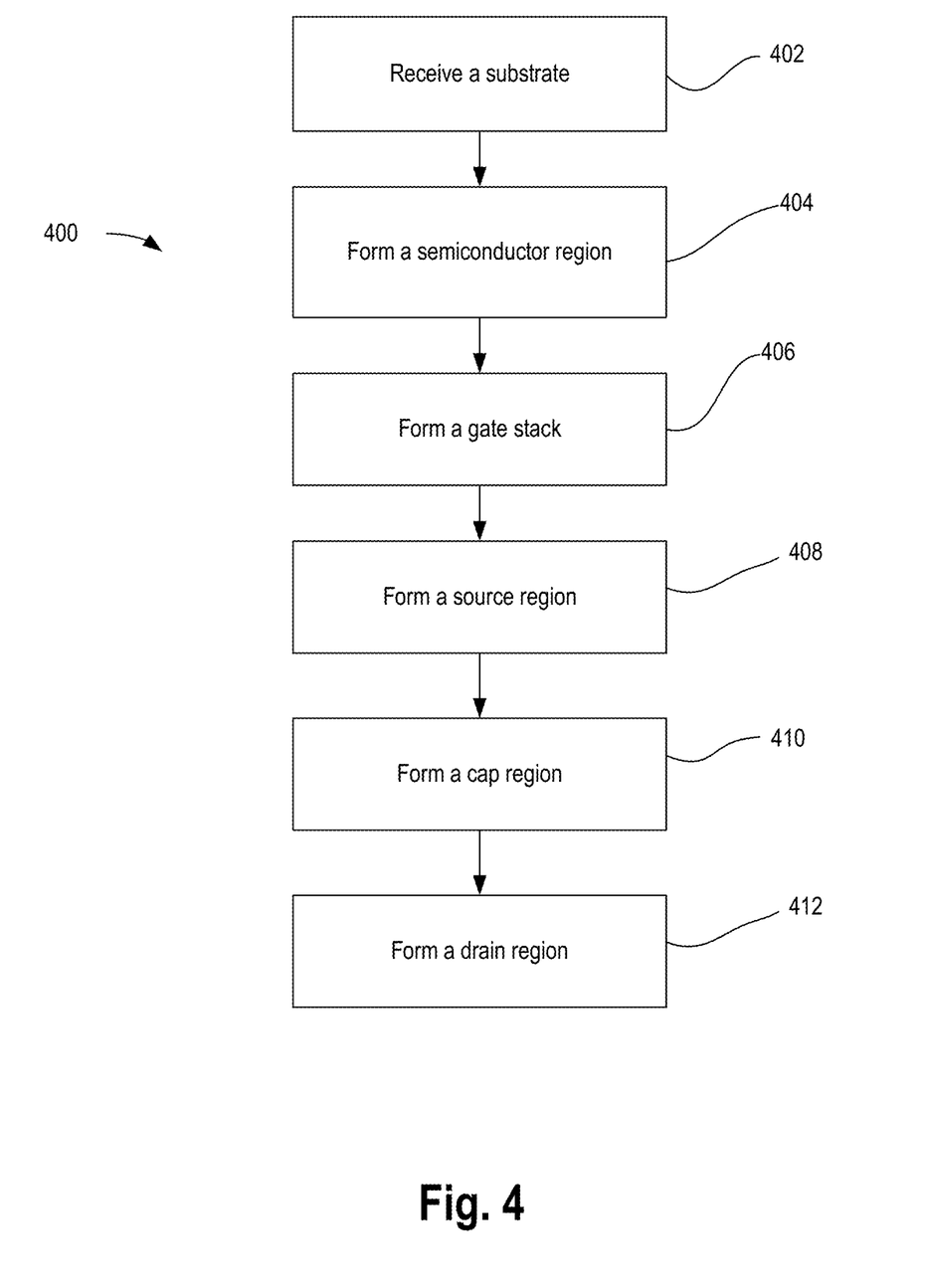
FIG. 4 illustrates a flowchart of a method of forming a semiconductor device with a thin film cap, in accordance with some embodiments.

FIG. 4 illustrates a flowchart of a method of forming a semiconductor device with a thin film cap, in accordance with some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 400 begins with receiving (402) substrate 102. In some embodiments, substrate 102 includes multiple layers that may include semiconductor material and/or oxides, for example. Next, semiconductor region 112 is formed (404) on substrate 102. In some embodiments, semiconductor region 112 is undoped germanium, while in other embodiments semiconductor region 112 may be other (doped or undoped) semiconductor material.

Then, gate region 108, gate dielectric 110, gate spacer 114, and gate spacer 116 may be formed (406) on semiconductor region 112 to create a gate stack. In some embodiments, gate region 108, gate dielectric 110, gate spacer 114, and/or gate spacer 116 include multiple layers. Next, source region 104 is formed (408) on one side of semiconductor region 112. In some embodiments, source region 104 includes a p-doped variant of the same semiconductor material as semiconductor region 112. In some embodiments, source region 104 is doped germanium.

The method continues with forming (410) cap region 118 on a side of semiconductor region 112 opposite source region 104. In some embodiments, cap region 118 is semiconductor material(s) having a higher band gap than semiconductor region 112. Finally, drain region 106 is formed (412) on cap region 118. In some embodiments, drain region 106 is a epitaxial thin film deposition on cap region 118 of a doped variant of a semiconductor material as semiconductor region 112.

Figure 5:
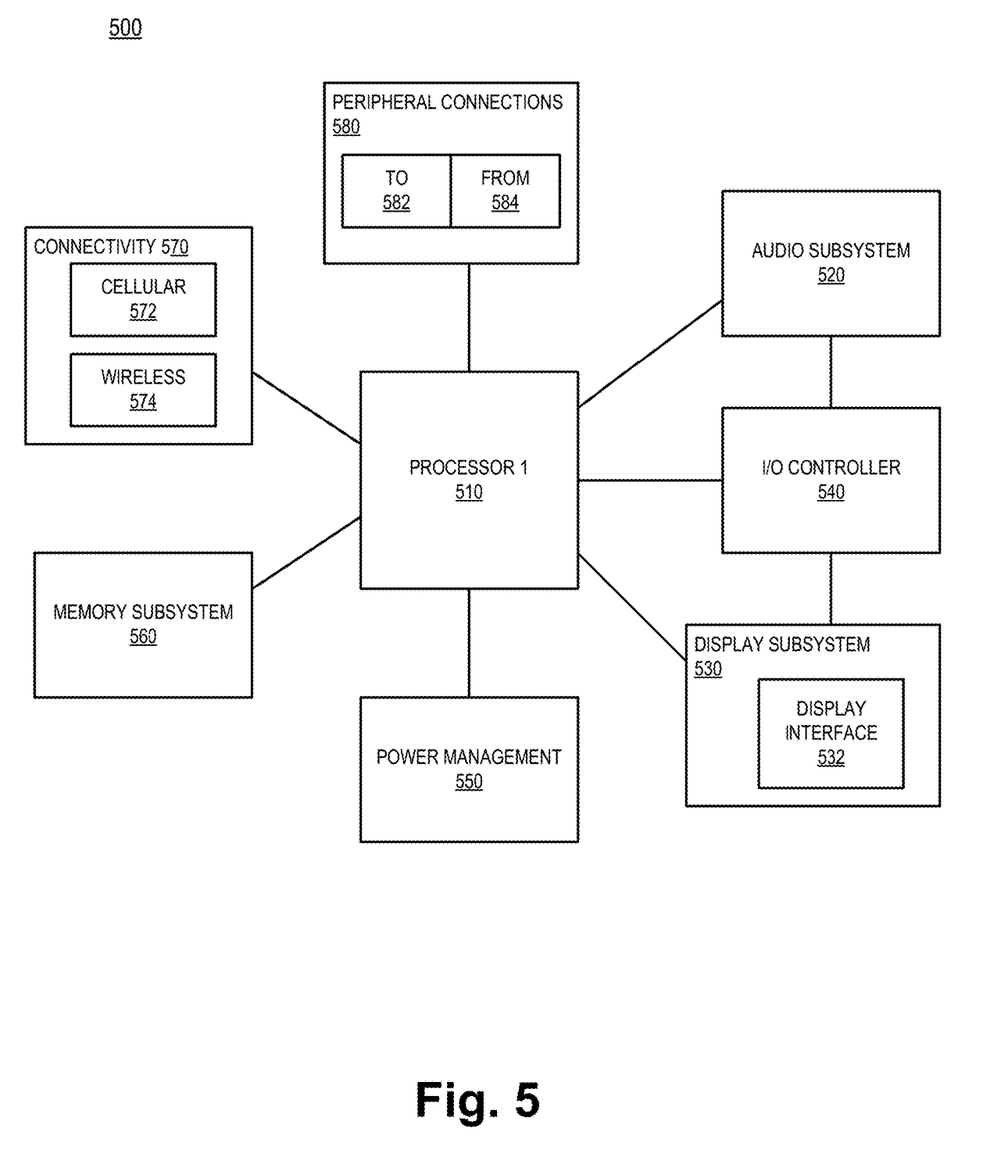
FIG. 5 illustrates a smart device or a computer system or a SoC (System-on-Chip) which includes a semiconductor device with a thin film cap, according to some embodiments.

FIG. 5 illustrates a smart device or a computer system or a SoC (System-on-Chip) 500 which includes a semiconductor device with a thin film cap, according to some embodiments. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500. In some embodiments, one or more components of computing device 500, for example processor 510 and/or memory subsystem 560, are include a semiconductor device with a thin film cap as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 500 includes a first processor 510. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Connectivity 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a semiconductor region on a substrate; a gate stack on the semiconductor region; a source region of doped semiconductor material on the substrate adjacent a first side of the semiconductor region; a cap region on the substrate adjacent a second side of the semiconductor region, wherein the cap region comprises semiconductor material of a higher band gap than the semiconductor region; and a drain region comprising doped semiconductor material on the cap region.

In some embodiments, the cap region comprises silicon. In some embodiments, the cap region comprises a thickness of about 5 nm or less. In some embodiments, the cap region comprises a layer of strained silicon over a layer of silicon-germanium. In some embodiments, the drain region comprises p-type doping. In some embodiments, the semiconductor region comprises germanium.

In another example, a PMOS device is provided comprising: a semiconductor region on a substrate; a gate stack on the semiconductor region; a source region of p-doped semiconductor material on the substrate adjacent a first side of the semiconductor region; a cap region of semiconductor material on the substrate adjacent a second side of the semiconductor region, wherein the cap region comprises a higher band gap than the semiconductor region; and a drain region of p-doped semiconductor material on the cap region.

In some embodiments, the drain region comprises a p-doped variant of a same semiconductor material as the semiconductor region. In some embodiments, the cap region comprises silicon. In some embodiments, the semiconductor region comprises germanium. In some embodiments, the cap region comprises a thickness of about 5 nm or less. In some embodiments, the source region and the drain region comprise raised source drains (RSD).

In another example, a method is provided comprising: forming a semiconductor region on a substrate; forming a gate stack on the semiconductor region; forming a source region of doped semiconductor material on the substrate adjacent a first side of the semiconductor region; forming a cap region of semiconductor material on the substrate adjacent a second side of the semiconductor region, wherein the cap region comprises a band gap higher than the semiconductor region; and forming a drain region of doped semiconductor material on the cap region.

In some embodiments, forming the drain region comprises forming an extrinsic semiconductor variant of a same semiconductor material as the semiconductor region. In some embodiments, forming the cap region comprises forming a thin film of about 5 nm or less. In some embodiments, forming the cap region comprises forming multiple layers of different semiconductor material. In some embodiments, the semiconductor region comprises germanium. In some embodiments, the cap region comprises strained silicon.

In another example, a method of forming a PMOS device is provided comprising: forming a semiconductor region on a substrate; forming a gate stack on the semiconductor region; epitaxially forming a source region of p-doped semiconductor material on the substrate adjacent a first side of the semiconductor region; epitaxially forming a cap region of semiconductor material on the substrate adjacent a second side of the semiconductor region, wherein the cap region comprises a band gap higher than the semiconductor region; and epitaxially forming a drain region of p-doped semiconductor material on the cap region.

In some embodiments, the cap region comprises a band gap of greater than about 1 eV. In some embodiments, epitaxially forming the drain region comprises epitaxially forming a faceted raised drain. In some embodiments, the cap region comprises silicon. In some embodiments, the cap region comprises a thickness of about 5 nm or less. In some embodiments, forming the source region further comprises forming a second cap region. In some embodiments, the semiconductor region comprises germanium.

In another example, a system is provided comprising: a display subsystem; a wireless communication interface; and an integrated circuit device, the integrated circuit device comprising: a semiconductor region on a substrate; a gate stack on the semiconductor region; a source region of doped semiconductor material on the substrate adjacent a first side of the semiconductor region; a cap region on the substrate adjacent a second side of the semiconductor region, wherein the cap region comprises semiconductor material of a higher band gap than the semiconductor region; and a drain region comprising doped semiconductor material on the cap region.

In some embodiments, the cap region comprises silicon. In some embodiments, the cap region comprises a thickness of about 5 nm or less. In some embodiments, the cap region comprises a layer of strained silicon over a layer of silicon-germanium. In some embodiments, the drain region comprises p-type doping. In some embodiments, the semiconductor region comprises germanium.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
 a channel region comprising a first semiconductor material;
 a gate stack on the channel region;
 a source region comprising semiconductor material of a first conductivity type adjacent to a first side of the channel region;
 a cap region adjacent to a second side of the channel region, wherein the cap region comprises a second semiconductor material of a higher band gap than the first semiconductor material, and wherein the cap region comprises a layer of strained silicon over a layer of silicon-germanium; and a drain region comprising semiconductor material of the first conductivity type and with a smaller band gap than the second semiconductor material, wherein the cap region is between the channel region and the drain region.

2. The apparatus of claim 1, wherein the cap region comprises more silicon than the channel region and the drain region.

3. The apparatus of claim 1, wherein the cap region has a thickness of no more than 5 nm between the channel region and the drain region.

4. The apparatus of claim 1, wherein the drain region comprises p-type doping.

5. The apparatus of claim 1, wherein the semiconductor region comprises germanium.

6. A PMOS device comprising:
a channel region of semiconductor material on a substrate, wherein the channel region comprises Ge;
a gate stack on the channel region;
a source region on the substrate and adjacent to a first side of the channel region, wherein the source region is a p-doped variant of the same semiconductor material as the channel region;
a cap region of semiconductor material on the substrate adjacent to a second side of the channel region, wherein the cap region has a higher band gap than the channel region, and wherein the cap region comprises a layer of strained silicon over a layer of silicon-germanium; and
a drain region, wherein the drain region comprises the p-doped variant of the same semiconductor material as the channel region and wherein the cap region is between the channel region and the drain region.

7. The PMOS device of claim 6, wherein the channel region, the source region, and the drain region are Ge or SiGe.

8. The PMOS device of claim 7, wherein the cap region has a thickness of no more than 5 nm between the channel region and the drain region.

9. The PMOS device of claim 7, wherein the source region and the drain region comprise raised source and drain (RSD).

10. The PMOS device of claim 7, wherein the channel region, the source region, and the drain region are Ge.

11. A method comprising:
forming a semiconductor region on a substrate;
forming a gate stack on the semiconductor region;
forming a source region of doped semiconductor material on the substrate adjacent a first side of the semiconductor region;
forming a cap region of semiconductor material on the substrate adjacent a second side of the semiconductor region, wherein the cap region has a band gap higher than the semiconductor region, and wherein forming the cap region comprises forming a layer of strained silicon over a layer of silicon-germanium; and
forming a drain region of doped semiconductor material on the cap region, wherein the cap region is between the channel region and the drain region.

12. The method of claim 11, wherein forming the drain region comprises forming an extrinsic semiconductor variant of a same semiconductor material as the region.

13. The method of claim 11, wherein forming the cap region comprises forming a thin film of about 5 nm or less.

14. The method of claim 11, wherein the region comprises germanium.

15. The method of claim 11, wherein the cap region comprises a band gap of greater than about 1 eV.

16. The method of claim 11, wherein epitaxially forming the drain region comprises epitaxially forming a faceted raised drain.

17. The method of claim 11, wherein the cap region comprises a thickness of about 5 nm or less.

18. The method of claim 11, wherein forming the source region further comprises forming a second cap region.

19. The method of claim 11, wherein forming the source region and the drain region comprises depositing Ge.

* * * * *